(12) United States Patent
Azioune et al.

(10) Patent No.: US 10,159,974 B2
(45) Date of Patent: Dec. 25, 2018

(54) SURFACE TREATMENT OF MICROFLUIDIC DEVICES

(71) Applicants: TOTAL PETROCHEMICALS FRANCE, Courbevoie (FR); ECOLE SUPERIEURE DE PHYSIQUE ET CHIMIE INDUSTRIELLES DE LA VILLE DE PARIS, Paris (FR); CENTRE NATIONAL DE LA RECHERCHE SCIENTIFIQUE—CNRS, Paris (FR)

(72) Inventors: Ammar Azioune, Merignac (FR); Denis Bartolo, Paris (FR); Bertrand Levache, Paris (FR); Vincent Studer, Bordeaux (FR)

(73) Assignees: TOTAL PETROCHEMICALS, Courbevoie (FR); ECOLE SUPERIEURE DE PHYSIQUE ET CHIMIE INDUSTRIELLES DE LA VILLE DE PARIS, Paris (FR); CENTRE NATIONAL DE LA RECHERCHE SCIENTIFIQUE-CNRS, Paris (FR)

( * ) Notice: Subject to any disclaimer, the term of this patent is extended or adjusted under 35 U.S.C. 154(b) by 310 days.

(21) Appl. No.: 14/384,764

(22) PCT Filed: Mar. 11, 2013

(86) PCT No.: PCT/FR2013/050508
§ 371 (c)(1),
(2) Date: Nov. 18, 2014

(87) PCT Pub. No.: WO2013/136003
PCT Pub. Date: Sep. 19, 2013

(65) Prior Publication Data
US 2015/0224498 A1    Aug. 13, 2015

(30) Foreign Application Priority Data

Mar. 13, 2012 (FR) .................................. 12 52245

(51) Int. Cl.
*B01L 3/00* (2006.01)
*B81C 1/00* (2006.01)

(52) U.S. Cl.
CPC .... *B01L 3/502707* (2013.01); *B81C 1/00206* (2013.01); *B01L 2200/12* (2013.01); *B81B 2201/05* (2013.01); *Y10T 29/49* (2015.01)

(58) Field of Classification Search
CPC .......... B01L 3/502707; B01L 2200/12; B81C 1/00206; B81C 2201/05
See application file for complete search history.

(56) References Cited

U.S. PATENT DOCUMENTS 8,470,701 B2 * 6/2013 Rogers .................. B81B 7/0093
257/E21.09
2003/0173223 A1 * 9/2003 Gascoyne ............... B03C 5/028
204/547

(Continued)

FOREIGN PATENT DOCUMENTS

JP    2008 058132      3/2008
JP    2008058132 A *  3/2008

OTHER PUBLICATIONS

English Translation of JP-2008-58132.*

(Continued)

*Primary Examiner* — Jacob J Cigna
(74) *Attorney, Agent, or Firm* — McAndrews, Held & Malloy, Ltd.

(57) ABSTRACT

The invention relates to a surface treatment method for treating the inner walls of a microchannel made from a polymeric material that is at least partially photocured or thermoset. Said treatment is carried out via irradiation in the (Continued)

air at a wavelength of less than or equal to 300 nm. The invention also relates to a method for manufacturing a microfluidic device including such a surface treatment step.

8 Claims, 3 Drawing Sheets

(56) References Cited

U.S. PATENT DOCUMENTS

| | | | |
|---|---|---|---|
| 2003/0232961 A1* | 12/2003 | Manias | B82Y 30/00 528/272 |
| 2007/0202560 A1* | 8/2007 | Kikuchi | B01L 3/502707 435/14 |
| 2008/0241512 A1* | 10/2008 | Boris | B05D 1/60 428/328 |
| 2009/0250130 A1 | 10/2009 | Studer | |

OTHER PUBLICATIONS

Sollier et al, Comparison of Rapid Prototyping Polymers for High Pressure Injections, 2011, 3 Pages.*
Chia-Jung Chang et al 2010 J. Micromech. Microeng. 20 115031.*
V.N. Vasilets, "Improvement of the micro-wear resistance of silicone by vacuum ultraviolet irradiation", Polymer vol. 38 No. 13 1998 pp. 2875.*
Berdichevsky, "UV/ozone modification of poly(dimethylsiloxane) microfluidic channels", Sensors and Actuators B 97 (2004) 402-408.*
Efimenko, "Surface Modification of Sylgard-184 Poly(dimethyl siloxane) Networks by Ultraviolet and Ultraviolet/Ozone Treatment", Journal of Colloid and Interface Science 254, 306-315 (2002).*
Berdichevsky et al., "UV/ozone modification of poly(dimethylsiloxane) microfluidic channels," Sensors and Actuators B: Chemical: International Journal Devoted to Research and Development of Physical and Chemical Transducers, 97(2-3):402-408 (2004) XP 004486646.
Chia-Jung Chang et al., "Fabrication of a SU-8-based polymer-enclosed channel with a penetrating UV/ozone-modified interior surface for electrokinetic separation of proteins; Fabrication of a SU-8-based polymer-enclosed channel," Journal of Micromechanics & Microengineering, 20(11):115031 (2010) XP020200305.
Hillborg et al., "Crosslinked polydimethylsiloxane exposed to oxygen plasma studied by neutron reflectometry and other surface specific techniques," Polymer, 41:6851-6863 (2000).
International Search Report in PCT/FR2013/050508 dated Dec. 16, 2013.
Zhou et al., "Recent developments in PDMS surface modification for microfluidic devices," Electrophoresis, 31:2-16 (2010).

* cited by examiner

SURFACE TREATMENT OF MICROFLUIDIC DEVICES

The present application is filed pursuant to 35 U.S.C. 371 as a U.S. National Phase application of International Patent Application No. PCT/FR2013/050508, which was filed Mar. 11, 2013, claiming the benefit of priority to French Patent Application No. 1252245, which was filed on Mar. 13, 2012. The entire text of the aforementioned applications is incorporated herein by reference in its entirety.

TECHNICAL FIELD OF THE INVENTION

The invention relates to a process for treating the surface of the internal walls of a microchannel, in a microfluidic device, and to a process for manufacturing a microfluidic device comprising such a surface treatment step.

PRIOR ART

Microfluidics is a branch of the sciences that studies and attempts to make use of the mechanisms of the flow of fluids, liquids or gases through channels having dimensions ranging from the order of a millimeter to the order of a nanometer. This discipline has experienced remarkable growth during the last twenty years, and is used in many fields, such as chemistry, biotechnology, biology and fluid mechanics.

Many methods for manufacturing microfluidic devices have been described in the literature. However, the method that is most commonly used consists in manufacturing microfluidic devices from thermo- or photo-set polymers by replication using a mould. This method has the advantage of being simple, effective, rapid and inexpensive. One of the most commonly used thermo-set polymers is polydimethylsiloxane (PDMS).

One of the problems related to the use of these materials resides in the fact that they are naturally not very hydrophilic and may even be hydrophobic. The microchannels in the microfluidic devices obtained are therefore not or not very hydrophilic. However, for many applications, it would be advantageous to be able to have microfluidic devices with completely or partially hydrophilic microchannels. Furthermore, it would be useful to provide a process allowing the hydrophilic or hydrophobic character of the walls of the microchannels to be controlled and adjusted. It would also be useful to provide a process allowing the walls of the microchannels to be textured. The term "textured" is understood to mean local modification, according to a desired pattern, of the hydrophilic or hydrophobic character of the walls of the microchannels.

Surface treatments for microfluidic devices have already been studied and described, principally for applications in the field of biology. For example, the scientific article by Zhou et al. entitled "Recent developments in PDMS surface modification for microfluidic devices" (*Electrophoresis* 2010, 31, 2-16) contains a review of various methods for treating the surface of PDMS. Generally, surface treatments are divided into two types: physical treatments and chemical treatments. Chemical treatments, such as coating deposition or functionalization of the surface by chemical processing, obtain very good results but have the major disadvantage of not allowing precise localized treatment. Furthermore, chemical treatments are difficult to implement. Moreover, known chemical treatments do not allow very hydrophilic surfaces to be obtained: the contact angle of water in air obtained after chemical treatment is always higher than 50°.

The advantage of physical treatments is that they allow, simply, a device to be treated locally.

The most common physical treatment is treatment with oxygen plasma. This treatment is for example described in the article "Crosslinked polydimethylsiloxane exposed to oxygen plasma studied by neutron reflectometry and other surface specific techniques" by Hillborg et al. (*Polymer* 41 (2000) 6851-6863). The major problem with this type of technique is that the material very rapidly loses its hydrophilic character after treatment. The hydrophilic character can be maintained over a long period of time only at the price, either of additional treatments, or of storage under particular conditions.

One solution to this problem was proposed by Berdichevsky et al. in the article "UV/ozone modification of poly(dimethylsiloxane) microfluidic channels" (*Sensor and Actuators B* 97 (2004) 402-408). It is proposed in this article to treat devices made of PDMS with an oxygen plasma, then by UV irradiation under ozone. The latter treatment, which lasts at least 30 minutes, allows the PDMS to be oxidized in-depth and thus the hydrophilic character of the surface obtained by virtue of the oxygen plasma treatment to be maintained. However, this modification of the material in-depth causes the material to lose its mechanical properties. This oxidation in-depth in particular causes the material to shrink by about 30%. Nevertheless, this treatment in-depth is indispensable according to the authors of this article because it is by virtue of this oxidation, in-depth, of the polymer that the hydrophilic/hydrophobic character of the surface is durably modified over time.

Another scientific publication (CHANG et al. "Fabrication of a SU-8-based polymer-enclosed channel with a penetrating UV/ozone-modified interior surface for electrokinetic separation of proteins", *Journal of Micromechanics and Microengineering,* 20 (2010) 115031) describes a process for making the naturally hydrophobic surfaces of a microchannel made of SU-8 (an epoxy-based material) permanently and uniformly hydrophilic. This process consists in irradiating the walls of the microchannel with 254 nm UV in an environment rich in ozone after the device has been closed. This process therefore requires the use of ozone, which is a constraint in terms of equipment and cost. In addition, the UV radiation is able to penetrate into the microchannel only after it is passed through the upper portion of the microfluidic device, which is made of SU-8. This article states that only 8% of the radiation actually passes through the material, thereby implying that 92% of the radiation is absorbed, probably causing modification in-depth of the material forming the upper portion of the device.

This article also suggests an alternative method that consists in irradiating the material at 172 nm in ambient atmosphere, the ozone then being generated in situ. However, this embodiment cannot be implemented in practice with the process described in this article insofar as the material SU-8 is not transparent to UV having a wavelength of 172 nm. Irradiation of the microchannel in the microfluidic device after it has been closed, according to this alternative method described in this article, is therefore not realizable.

Lastly, Japanese patent application JP 2008 058132 describes a process for treating the surface of a microfluidic device made of polydimethylsiloxane, in order to make the latter hydrophilic without forming cracks. In this process, a UV irradiation at 172 nm is applied to the polydimethylsiloxane substrate in which the microchannel is formed and to the cover before the device is closed. In situ surface treatment of the microchannel is not possible. In addition, this Japanese document provides for the irradiation to be carried out such that the portion of the substrate forming the microchannel and the portion of the substrate forming the adhesive surface that is intended to ensure the joint with the cover each receive a UV irradiation of different energy. To do this, either two successive irradiations must be carried out with different masks, or the irradiation must be carried out with a particular mask having a modulable optical density. Therefore, this process is not easy to implement because it either requires a plurality of successive irradiation steps that are associated with delicate mask aligning steps, or the use of specific masks having a modulable optical density.

The objective of the present invention is inter alia to provide a process for treating the surface of microfluidic devices made of photo-set or thermo-set polymers, allowing the hydrophilic or hydrophobic character of microchannel walls to be controllably and locally modified, this process not having the drawbacks of the prior art.

SUMMARY OF THE INVENTION

It is in this context that the inventors have developed a surface treatment process intended for treating the internal walls of a microchannel formed in an at least partially photo-set or thermo-set polymer. This treatment is achieved by irradiation under air at a wavelength shorter than or equal to 300 nm.

More precisely, one object of the present invention is a process for treating the surface of the internal walls of a microchannel, in a microfluidic device, intended to modify at least locally the surface energy of said walls, the microchannel being bounded by a profiled element made of an at least partially photo-set or thermo-set polymer and by a cover, comprising a step consisting in irradiating under air,
    either said at least partially photo-set or thermo-set polymer through the cover, the cover and the profiled element having been assembled beforehand, the cover being made of a material that is transparent to said irradiations;
    or directly said at least partially photo-set or thermo-set polymer, those portions of the profiled element which are intended to ensure the joint with the cover having been protected beforehand from said irradiations so that said portions are not modified by irradiation before joining with the cover,
the irradiation being carried out at a wavelength shorter than or equal to 300 nm, and said treatment process preserving intact the bulk properties of the material.

Another object of the invention is a process for manufacturing a microfluidic device, comprising:
    a step of preparing a profiled element made of an at least partially photo-set or thermo-set polymer; and
    a step of closing the profiled element with a cover so as to bound at least one microchannel,
    characterized in that the process furthermore comprises a step of treating the surface of at least one portion of the internal walls of said microchannel with the process defined in the present invention.

Lastly, the use of an irradiation under oxygen at a wavelength shorter than or equal to 300 nm, and preferably from 150 to 260 nm, to make at least locally more hydrophilic the walls of a microchannel formed in an at least partially photo-set or thermo-set polymer while preserving intact the bulk properties of said material, is also described here.

DETAILED DESCRIPTION

Figure 1:
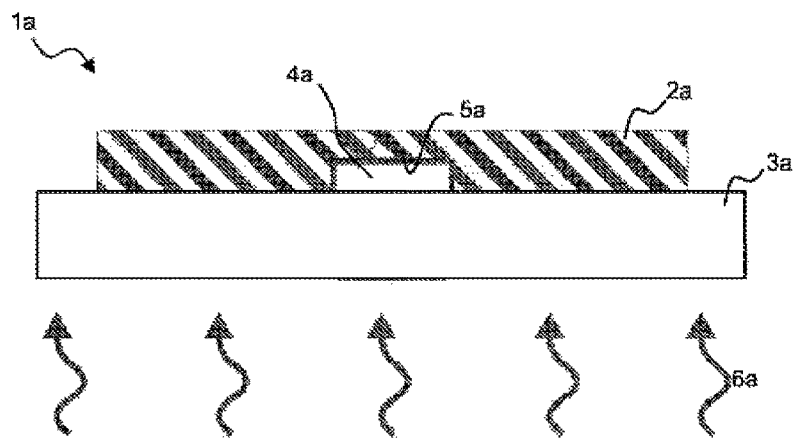
FIG. 1 shows one embodiment of the surface treatment process according to the invention.

The expression "microfluidic device" is understood in the present invention to mean a device comprising at least one microchannel in which a fluid, and in particular a liquid, may flow. A microchannel is a channel at least one of the dimensions of which, typically its height and/or width, is of the order of one nanometer to one millimeter, typically between 1 nm and 1 mm, in size. The microfluidic device may furthermore comprise one or more reservoirs, one or more reaction chambers, one or more mixing chambers and one or more separation zones.

The microchannel is bounded in the microfluidic device by its internal walls. In the process for manufacturing the microfluidic device, the internal walls of the microchannel may be made of one material or a plurality of different materials. According to the invention, the microchannel is bounded by a profiled element made of a first material and by a cover made of a second material. The first and second material may be the same material or different materials. According to one conventional embodiment, the cover is a flat element. The profiled element therefore has a shape that allows it, when it is closed by a flat cover, to define a microchannel. However, any other configuration may be envisaged in the present invention. In particular, it is envisaged to provide a cover that is not flat, for example itself having a profiled shape and optionally containing apertures.

In the process according to the invention, the profiled element bounding the microchannel is made of an at least partially photo-set or thermo-set polymer.

In contrast to thermoplastic polymers, thermo- or photo-setting polymers are plastics that are practically impossible to melt or dissolve after they have been polymerized. Before polymerization, the material, qualified a thermo- or photo-setting resin, takes the form of a liquid or paste. The polymerization (or curing) of the resin is achieved by a heat treatment in the case of thermo-setting resins or by irradiation in the case of photo-setting resins.

Thermo- or photo-set polymers are particularly well suited to the production of microfluidic devices. Indeed, the step consisting in closing, then optionally sealing, the profiled element with the cover is simpler to carry out with thermo- or photo-set polymers than with thermoplastics. An example of manufacture of microfluidic devices from thermo-or photo-setting resins may be found in international patent application WO 2008/009803.

The expression "at least partially photo-set or thermo-set" is understood, such as used in the present application, to mean that the polymerization of the resin may or may not be complete. Thus, the material may be completely polymerized or partially polymerized and partially in resin form.

Among the least partially thermo-set polymers able to be used in the present invention, mention may be made of PDMS (polydimethoxysilane), polyurethane and PMMA (polymethyl methacrylate).

The polymer of the invention may advantageously be an at least partially photo-set polymer. Polymerization by irradiation is easy to implement, inexpensive, enables rapid prototyping and yields a product that is endowed with a very high resolution. Preferably, the polymer is obtained from a photo-setting resin by irradiation at a wavelength longer than 300 nm, preferably from 320 to 800 nm.

Among the at least partially photo-set polymers that may be used in the present invention, mention may be made of the products sold by Norland Optics under the trademark NOA® Norland Optical Adhesives, in particular the products NOA®81 and NOA®60, the products sold by Dymax in the "Dymax Adhesive and light curing systems" range, the products sold by Bohle in its "UV adhesives" range and the products sold by Sartomer under the trade references SR496 and SR499.

Advantageously, the at least partially photo-set or thermo-set polymer of the invention may be a material conventionally used as an adhesive, glue or surface coating in the field of optics, these materials have the advantage of being transparent and free from bubbles or any other irregularities. They are appropriate for optical detection and observation.

According to one particularly advantageous embodiment, the at least partially photo-set or thermo-set polymer of the invention is obtained from a mercaptoester-containing liquid photo-setting resin that crosslinks via thiolene type reactions. It is in particular a question of the product NOA®81 sold by Norland Optics. This material has the advantage of well resisting to pressure and the organic and aqueous solvents.

Materials having a non-elastomeric or not very elastomeric character are preferred for their capacity to resist to pressure.

The process that is the subject of the present invention comprises a step consisting in irradiating under air, therefore in the presence of oxygen, the at least partially photo-set or thermo-set polymer.

The irradiation is carried out at a wavelength shorter than or equal to 300 nm. Preferably, the irradiation is carried out at a wavelength ranging from 150 to 260 nm. It is possible to irradiate at a single wavelength, at a plurality of wavelengths, for example two or three wavelengths, or using a continuous spectrum of wavelengths.

The material may be irradiated by means of an ultraviolet (UV) lamp. Many UV lamps allowing UV light having the desired wavelength to be produced are commercially available. The UV lamp may be arranged in any way, insofar as the light produced irradiates the material.

The power of the irradiation emitted by the lamp may be comprised between 10 and 200 mW/cm$^2$ and preferably between 25 and 30 mW/cm$^2$.

The irradiation takes place in the presence of oxygen. The oxygen ($O_2$) may be brought into contact with the material in pure gaseous form or in the form of a gas mixed with other gases. In the present invention, it is air. The oxygen absorbs some of the UV radiation and forms ozone ($O_3$). The oxygen and ozone disassociate under irradiation at 184.9 nm and at 253.7 nm, respectively. The chemical species that are formed are particularly reactive and contribute, with the irradiation, to the modification of the treated surface.

The irradiation power received by a material depends on the irradiation power emitted by the irradiation source, but also on the amount of irradiation absorbed by the oxygen. This amount itself depends on the concentration of oxygen in the medium and on the distance separating the irradiation source and the treated surface. Those skilled in the art will be able to adjust these various parameters in order to ensure the desired irradiation power is received by the surface.

The surface treatment process of the invention also has the feature of preserving intact the bulk properties of the material.

It is possible for a person skilled in the art to verify experimentally whether the bulk properties of the material have been preserved after the surface treatment. This condition is considered to be met if at least one bulk property is preserved.

One easily measurable material bulk property is the elastic modulus of the material. For example, it may be verified that the elastic modulus of the material has been preserved by observing the deformation of a microchannel or by measuring the flow rate response time of a device.

Deformation of a microchannel is observed by injecting a fluid into this microchannel at a set pressure and by measuring the width of the microchannel. If the width of the microchannel is the same before and after the surface treatment, then the elastic modulus of the material has been preserved.

The flow rate response time of a device is measured by injecting a fluid into the microchannel with a set flow rate, then by stopping this injected flow and measuring the time that passes between the moment when the injected flow is stopped and the moment when fluid flow stops at a precise point in the microchannel. The measurement may be carried out in a conventional way using the particle image velocimetry (PIV) technique. If the response time of the microchannel is the same before and after the surface treatment, then the elastic modulus of the material has been preserved.

Those skilled in the art will be able to adjust the surface treatment process in order to control the depth of the treatment so that the bulk properties of the material are not degraded. Advantageously, the depth of the treatment may be 100 nm or less. The depth of the treatment may be smaller than 1% of the total thickness of the microfluidic device, advantageously smaller than 1 per 1000, and even more advantageously smaller than 1 per 10,000. Preferably, the irradiation step lasts less than 20 minutes and preferably from 2 to 15 minutes.

Preferably, in order to obtain maximum hydrophilization, the operating conditions are chosen so that the irradiated surfaces receive an irradiation energy comprised between 1000 mJ/cm$^2$ and 3000 mJ/cm$^2$, more preferably between 1500 mJ/cm$^2$ and 3000 mJ/cm$^2$, and even more preferably between 2000 mJ/cm$^2$ and 3000 mJ/cm$^2$. However, lower irradiation energies especially comprised between 0 mJ/cm$^2$ and 1000 mJ/cm$^2$, and more preferably between 100 mJ/cm$^2$ and 1000 mJ/cm$^2$, may advantageously be used to modulate the surface energy and therefore the wetting and adhesion properties of the surfaces.

The process that is the object of the present invention comprises a step consisting in irradiating under air:
- either said at least partially photo-set or thermo-set polymer through the cover, the cover and the profiled element having been assembled beforehand, the cover being made of a material that is transparent to said irradiations;
- or directly said at least partially photo-set or thermo-set polymer, those portions of the profiled element which are intended to ensure the joint with the cover having been protected beforehand from said irradiations.

The irradiation may therefore be carried out after the cover and the profiled element have been assembled or before the cover and the profiled element have been assembled.

In the first alternative, the cover is made of a material that is transparent to the irradiations. This embodiment is particularly advantageous because it allows the wettability of the internal walls of a microchannel to be modified in situ after the microchannel has been produced. Thus, the surface treatment is independent of the manufacture of the microfluidic device. The microfluidic device may therefore be prepared using techniques that are already known and mastered. In particular, the surface treatment according to the invention has no influence on the quality of the joint between the profiled element and the cover.

In this first alternative, the at least partially photo-set or thermo-set polymer is irradiated through the cover. Among materials that are transparent to the irradiations used in the surface treatment step, mention may be made of quartz, sapphire and certain particular plastics that are transparent to UV. The cover may advantageously be a quartz plate because quartz, which is transparent, is appropriate for optical detection or observation.

The surface treatment process according to this first alternative is schematically shown in FIG. 1.

The microfluidic device 1a comprises a profiled element made of an at least partially photo-set or thermo-set polymer 2a and a cover 3a made of quartz. The profiled element 2a and the cover 3a have been assembled and bound a microchannel 4a.

So as to modify the surface energy of the internal walls 5a of the microchannel 4a, the polymer is irradiated through the cover 3a—the arrows 6a represent the irradiation.

In the second alternative, those portions of the profiled element which are intended to ensure the joint with the cover are protected beforehand and the at least partially photo-set or thermo-set polymer is directly irradiated. Those portions of the profiled element which are intended to ensure the joint with the cover are in particular the surfaces of the profiled element that will be brought into contact with the cover during assembly.

The portions of the profiled element may be protected by masking. The masking may be achieved, then the masking may be removed using methods known in the art. For example, a mask may be produced by depositing a metal deposit, taking the form of the desired pattern, on a carrier that is transparent to the UV irradiations, preferably on a quartz plate. This mask may then be placed on, and preferably as close as possible to, the sample, the irradiation is carried out through the mask and then the mask is removed. The step of masking certain portions of the polymer allows these portions to be protected from the irradiations of the surface treatment. The portions thus completely protected from the irradiation are not modified by irradiation before being joined with the cover. The process according to the invention in particular does not comprise an additional irradiation step intended to modify those portions of the profiled element which are intended to ensure the joint with the cover before the step closing. This is advantageous because the assembly of the profiled element with the cover may then be carried out using techniques that are known and mastered, no particular additional operations being required relative to the assembly of a microfluidic device that has not undergone the surface treatment according to the invention. The surface treatment according to the invention thus has no influence on the quality of the joint between the profiled element and the cover.

In this second alternative, the cover may be made of any material. Advantageously, the cover may be made of a material that is identical to that of the profiled element. This process allows microfluidic devices to be produced with a microchannel all the walls of which are made of the same material.

Furthermore, it is envisioned to treat the surface of the cover forming one wall of the microchannel in the same way as the profiled element. In this way, the treatment process according to the invention is applied to all of the walls of the microchannel.

Figure 2:
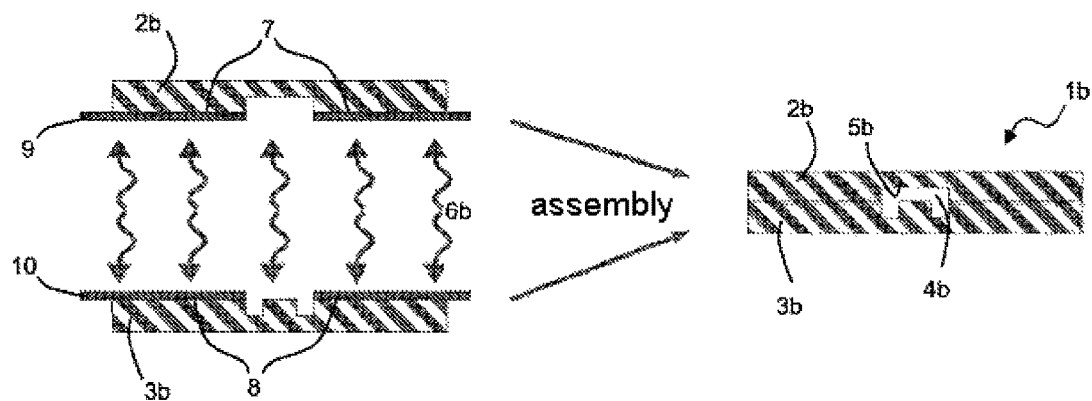
FIG. 2 shows another embodiment of the surface treatment process according to the invention.

The surface treatment process according to this first alternative is schematically shown in FIG. 2.

The microfluidic device 1b comprises a profiled element made of an at least partially photo-set or thermo-set polymer 2b and a cover 3b made from the same at least partially photo-set or thermo-set polymer. The cover 3b is not flat but contains grooves. After assembly, the profiled element 2b and the cover 3b bound a microchannel 4b.

During assembly, areas 7 of the profiled element 2b make contact with areas 8 of the cover 3b. The areas 7 and 8 were protected beforehand by masks 9 and 10.

In order to modify the energy of the entire surface of the internal walls 5b of the microchannel 4b, the polymer of the profiled element 2b and the polymer of the cover 3b are irradiated, the arrows 6b representing the irradiation. In contrast, the areas 7 and 8 completely protected by the masks 9 and 10 are not modified by irradiation.

After the masks 9 and 10 have been removed, the profiled element 2b and the cover 3b may be assembled.

The inventors have observed that the process according to the invention allows the surface energy of the internal walls of the microchannel to be modified at least locally.

The expression "surface energy" designates the free energy that exists at the surface separating two media. The wettability of a surface, i.e. the property of this surface over which a liquid may spread, depends on the surface energy between the surface in question, the liquid and the ambient gas. When this liquid is water, the hydrophilic or hydrophobic character of the surface is spoken of. The hydrophilic or hydrophobic character of a surface may be quantified by measuring the contact angle that a water droplet forms with the surface. Conventionally, the term "hydrophilic" designates a surface for which the contact angle of water in air is comprised between 0 and 90° and the term "hydrophobic" a surface for which the contact angle of water in air is comprised between 90° and 180°.

Throughout the present application, the term "contact angle" designates the advancing contact angle measured using conventional techniques well known to those skilled in the art.

Thermo- or photo-set polymers, in particular those used in the present invention, generally have a not very hydrophilic or even hydrophobic character. This is why, in a microfluidic device, the internal walls of the microchannel before surface treatment are naturally not very hydrophilic or even hydrophobic: the contact angle of water in air on the walls of the microchannel is typically larger than 80° and even than 90°.

The process that forms the subject of the present invention advantageously allows the wettability of the walls to be modified, and in particular the walls to be made more hydrophilic. The difference between the value of the contact angle of water in air on the walls of the microchannel before treatment and the value of the contact angle of water in air on the walls of the microchannel after treatment is advantageously comprised between 40 and 90°, more advantageously comprised between 50 and 80°, and even more advantageously comprised between 60 and 70°. Thus, after the surface treatment, the contact angle of water in air on the walls of the microchannel may advantageously be smaller than 20°, even smaller than 15°, and preferably comprised between 0 and 10°.

The inventors have discovered that the value of the contact angle of water in air on the walls of the microchannel after treatment depends on the amount of irradiation received by the surface. For a given device, with a given irradiation power, the value of the contact angle of water in air on the walls of the microchannel after treatment depends on the length of the irradiation step. The longer the irradiation step, the more hydrophilic the surface obtained. The process according to the invention thus makes simple and precise the control of the wettability of the treated surfaces.

Furthermore, the inventors have observed that the wettability of the treated surface is stable over time. Thus, the difference between the value of the contact angle of water in air on the walls of the microchannel just after treatment and the value of the contact angle of water in air on the walls of the microchannel after 10 days, and preferably after 25 days, of storage in ambient air is advantageously comprised between 0 and 20°, more advantageously comprised between 0 and 15°, and even more advantageously comprised between 0 and 10°. The microfluidic device treated according to the invention may therefore advantageously be stored for 10 days, and more advantageously for 25 days, without specific precautions, before being used.

Lastly, the treatment process according to the invention has the advantage of being able to be implemented locally. It is therefore possible, by virtue of the treatment process according to the invention, to texture the walls of the microchannels.

According to a preferred embodiment of the present invention, the at least partially photo-set or thermo-set polymer is locally irradiated, preferably with a pattern.

The surface treatment according to the invention may be applied only to certain zones of the polymer, for example by masking zones to which it is desired not to apply the treatment. The zones masked beforehand preserve their initial surface energy.

Alternatively, or in addition, the surface treatment according to the invention may be applied differently to various zones of the polymer. It is in particular possible to subject some zones of the polymer to various amounts of irradiation. Since the modification of the surface energy depends on the amount of irradiation received, it is thus possible to modify the surface energy of the polymer differently in different zones.

The microfluidic device obtained after the treatment according to the invention may contain zones having different wettabilities, the difference between the contact angle of water in air on two zones of the same microfluidic device possibly being larger than 60°, preferably larger than 80°, and more preferably comprised between 90 and 115°.

The pattern of the irradiation may be any pattern desired by a person skilled in the art.

In a first embodiment, the microchannel may be divided in the length direction into two equal strips that are symmetric about a midplane of the microchannel. One of the strips may be treated by the process according to invention, whereas the other is hidden by masking. When the masking is removed, a textured microchannel is obtained, one portion of the microchannel having a more hydrophilic character than the other.

In a second embodiment, the microchannel may be treated so as to have a decreasing wettability in the direction of its length. To do this, a movable mask may be used: the latter is initially placed so as to shield almost all of the microchannel, then the movable mask is slowly withdrawn, along the longitudinal axis of the channel, during the treatment according to the invention. The zones irradiated for the longest amount of time have their surface energy modified the most whereas the zones irradiated for the shortest amount of time have their surface energy modified the least. The mask movement may be stepped, allowing a stepped decrease in wettability to be obtained, or the movement of the mask may be a continuous movement, allowing a wettability that decreases continuously in space to be obtained.

Another object of the invention is a process for manufacturing a microfluidic device, comprising:
  a step of preparing a profiled element made of an at least partially photo-set or thermo-set polymer; and
  a step of closing the profiled element with a cover so as to bound at least one microchannel,
  characterized in that the process furthermore comprises a step of treating the surface of at least one portion of the internal walls of said microchannel with the process defined above.

The step of preparing a profiled element made of an at least partially photo-set or thermo-set polymer and the step of closing the profiled element with a cover so as to form at least one microchannel may be carried out according to the method described in international patent application WO 2008/009803.

Specifically, the step of preparing a profiled element may comprise the use of a stamp made of an elastomer to emboss a photo- or thermo-setting resin placed that a carrier, then an irradiating or heating step in order to form the profiled element.

This embodiment is particularly advantageous because the use of the elastomer stamp allows complete polymerization of the profiled element to be prevented. The interface between the profiled element and the stamp preserves a film of uncured resin. The presence of this film then allows the profiled element to be closed with a cover, and the enclosure formed to be sealed, for example via a simple irradiation.

The process according to the invention is advantageous insofar as the step of closing the profiled element with the cover may be carried out using known and mastered techniques, no specific treatments being required, despite the surface treatment of at least one portion of the internal walls of the microchannel. The step of closing the profiled element with a cover may for example employ thermal or chemical bonding. In one particularly preferred embodiment, the step of closing the profiled element with a cover is carried out by applying pressure, optionally followed by a step of sealing, for example by irradiation, at a wavelength corresponding to the curing wavelength of the polymer, or by heating. The cover may be made of a material that is identical or different from that of the profiled element.

The step of treating the surface of at least one portion of the internal walls of the microchannel that is then obtained may be carried out before the step of closing the microchannel or after the step of closing the microchannel.

According to a first embodiment, the surface treatment step is carried out after the closing step, the cover being made of a material that is transparent to the irradiations used in the surface treatment step. This embodiment is particularly advantageous because it allows the wettability of the internal walls of a microchannel to be modified in situ after the microchannel has been produced. Thus, the step of closing the microchannel and the step of treating the surface of the latter are independent from each other. The surface treatment step does not hamper the closing step. Conversely, the closing step does not impede the surface treatment step.

According to this first embodiment, the treatment of the surface of at least one portion of the internal walls of the microchannel is carried out with the process described above by irradiating the internal walls of the microchannel through the cover. Among the materials that are transparent to the irradiations used in the surface treatment step, mention may be made of quartz, sapphire and certain particular plastics that are transparent to UV. The cover may advantageously be a quartz plate because quartz, which is transparent, is appropriate for optical detection or observation.

According to a second embodiment, the surface treatment step is carried out before the closing step, the portions of the profiled element ensuring the joint with the cover being protected during the surface treatment from the irradiations used in the surface treatment step. The portions of the profiled element ensuring the joint with the cover are not modified by irradiation because they are completely protected.

The method for manufacturing a microfluidic device may then comprise the following consecutive steps:
the step of preparing a profiled element made of an at least partially photo-set or thermo-set polymer;
a step of masking certain portions of the polymer;
the step of treating the surface of at least one portion of the polymer, such as described above;
a step of removing the mask; and
the step of closing the profiled element with a cover so as to form at least one microchannel, the portions of the polymer that were masked being the portions making contact with the cover.

Advantageously, the process according to the invention does not comprise an intermediate step between the mask removal step and the closing step. The process may especially not comprise an additional irradiation step intended to modify those portions of the profiled element which are intended to ensure the joint with the cover before closing.

The masking may be achieved, then the masking may be removed using methods known in the art. For example, a mask may be produced by depositing a metal deposit, taking the form of the desired pattern, on a carrier that is transparent to the UV irradiations, preferably on a quartz plate. This mask may then be placed on, and preferably as close as possible to, the sample, the irradiation then being carried out through the mask and the mask then being removed. The step of masking certain portions of the polymer allows these portions to be protected from the irradiations of the surface treatment. Thus, a film of uncured resin is preserved on certain portions of the profiled element. This film then allows the profiled element to be closed with the cover.

According to this second embodiment, the cover may be made of any material. Advantageously, the cover may be made of a material that is identical to that of the profiled element. This process allows microfluidic devices to be produced with a microchannel all the walls of which are made of the same material.

Furthermore, it is envisioned to treat the surface of the cover forming one wall of the microchannel in the same way as the profiled element.

The process for manufacturing a microfluidic device may then comprise, in addition to the steps of preparing and treating the surface of the profiled element, the following consecutive steps:
a step of preparing the cover made of an at least partially photo-set or thermo-set polymer;
a step of masking certain portions of the polymer of the cover;
a step of treating the surface of at least one portion of the cover, such as described above;
a step of removing the mask; and
the step of closing the profiled element with the cover so as to form at least one microchannel, the portions of the polymer of the cover that were masked being the portions that make contact with the profiled element.

This embodiment makes it possible to manufacture a microfluidic device containing a microchannel all the walls of which are made of the same material and all the walls of which have been treated in the same way by the surface treatment process according to the invention.

Lastly, the use of an irradiation under oxygen at a wavelength shorter than or equal to 300 nm, and preferably from 150 to 260 nm, to make the walls of a microchannel formed in an at least partially photo-set or thermo-set polymer at least locally more hydrophilic while preserving intact the bulk properties of said material is also described here. The difference between the value of the contact angle of water in air on the walls of the microchannel before treatment and the value of the contact angle of water in air on the walls of the microchannel after treatment is advantageously comprised between 40 and 90°, more advantageously comprised between 50 and 80°, and even more advantageously comprised between 40 and 70°.

Other features and advantages of the invention will become apparent from the example described below.

EXAMPLES

Plates of NOA®81 were prepared according to the protocol below:

A few milliliters of NOA®81 were squeezed over a glass plate using a die with a planar surface of PDMS previously placed under vacuum for at least 30 minutes. The system was left in this way for 10 minutes in order to remove trapped air bubbles. Next, the assembly was exposed under a UV lamp for 7 seconds at a power of 12 mW/cm$^2$ so as to cure the resin. The die was then removed to obtain a glass plate covered with a layer of NOA®81.

The layer of NOA®81 had on its surface a pellicle of uncured resin. For the sake of the tests, the resin was completely cured. To do this, the glass plate was again placed under the UV lamp for 1 minute at 40 mW/cm$^2$.

One portion of the plates was treated according to the process that forms the subject of the present invention:

The plates were placed under a UV lamp having two emission peaks at 185 and 254 nm. The distance between the lamp and the plate was constant and about 3 cm. The atmosphere around the plates was air.

The length of the irradiation was varied between 0 seconds and 15 minutes.

Another portion of the plates was treated in the same way, except that the irradiation was carried out at a wavelength of 365 nm.

The wettability of the surfaces was evaluated by measuring the contact angle of water droplets in air on the plates of NOA®81 that had not had their surface treated and on the plates of NOA®81 that had had their surfaces treated with different exposure times.

The contact angle was measured using a DSA30 measurement apparatus from KRUSS. On each plate, one water droplet was deposited then swelled in order to measure the advancing contact angle. The angle was read using the software package provided with the apparatus.

Figure 3:
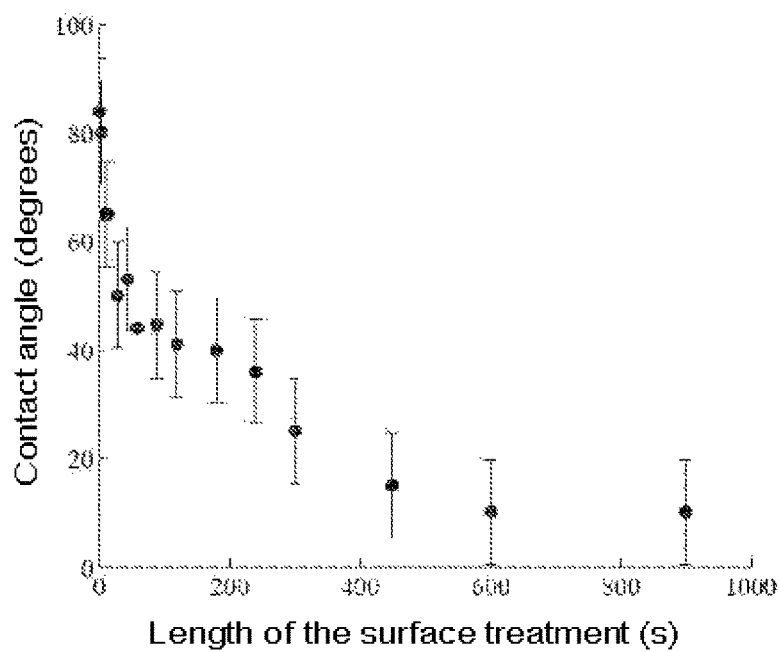
FIG. 3 shows the value of the contact angle of water in air on an NOA®81 surface as a function of the length of the surface treatment step (irradiation at 185 and 254 nm).

FIG. 3 shows the results of the contact angle measurements on the treated surfaces.

The untreated NOA®81 surface has a contact angle of about 80°. It will be observed that the value of the contact angle of water in air on the surface of the polymer after treatment depends on the length of the irradiation step. Here, the contact angle decreases to a value of about 10°.

Figure 4:
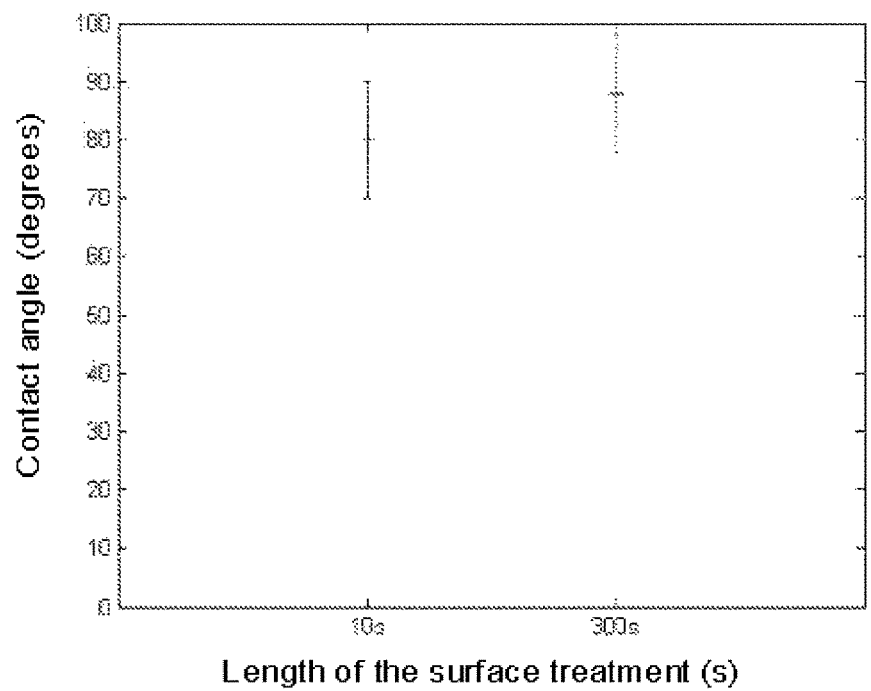
FIG. 4 shows the value of the contact angle of water in air on an NOA®81 surface as a function of the length of the surface treatment step (irradiation at 365 nm).

FIG. 4 shows the results of contact angle measurements on surfaces treated by irradiation at a wavelength of 365 nm. It will be observed that this treatment had no effect on the contact angle.

The stability of the hydrophilic character of the surface after treatment was evaluated by leaving plates treated according to the process described above, with an irradiation at 185 and 254 nm for 120 and 600 seconds, to age for 25 days. The plates were left exposed to open air, inside a Petri dish in order to protect them from dust and accidental contact.

Figure 5:
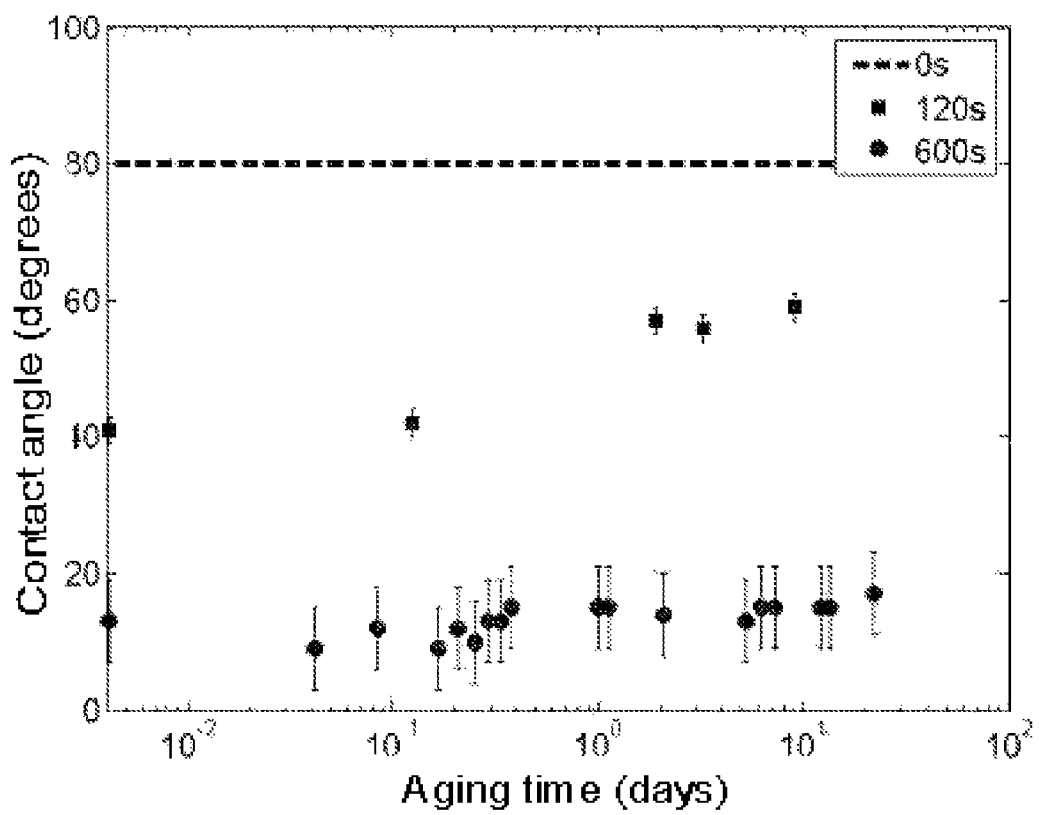
FIG. 5 shows the value of the contact angle of water in air on an NOA®81 surface as a function of ageing time, for two surface treatments of different lengths.

FIG. 5 shows the results of contact angle measurements as a function of ageing time for two irradiation times. The dotted line corresponds to the value of the contact angle on an untreated surface.

It will be observed that the contact angle values vary little over a length of time of about ten days. For the surface treated for 600 seconds, the contact angle had varied by about 10° at the end of 10 days. For the surface treated for 120 seconds, the contact angle had varied by about 20° at the end of 10 days.

Furthermore, it will be observed that despite its small variation, the contact angle did not increase to the value of the contact angle measured on an untreated surface. The surface treatment according to the invention clearly produces an effect that is durable over time.

The invention claimed is:

1. A process for treating a surface of the internal walls of a microchannel, in a microfluidic device, intended to modify at least locally a surface energy of said walls, the microchannel being bounded by a profiled element made of an at least partially photo-set polymer or partially thermo-set polymer and by a cover, said process comprising,
   a step of irradiating under air said at least partially photo-set polymer or partially thermo-set polymer through the cover, the cover and the profiled element having been assembled beforehand, the cover being made of a material that is transparent to irradiations;
   the step of irradiating under air being carried out at a wavelength shorter than or equal to 300 nm, and to a determined depth of irradiation,
   wherein the depth of irradiation is determined so that bulk properties of the at least partially photo-set polymer or partially thermo-set polymer are preserved.

2. The process of claim 1, wherein, the step of irradiating under air is carried out at a wavelength ranging from 150 to 260 nm.

3. The process of claim 1, wherein the step of irradiating under air lasts less than 20 minutes.

4. The process of claim 1, wherein said at least partially photo-set polymer or partially thermo-set polymer is irradiated only locally.

5. The process of claim 1 further comprising prior to the irradiating under air the following steps:
   a step of preparing the profiled element made of the at least partially photo-set polymer or partially thermo-set polymer; and
   a step of closing the profiled element with the cover so as to bound at least one microchannel.

6. The process of claim 1, wherein the depth of irradiation is 100 nm or less, or is smaller than 1% of the total thickness of the microfluidic device.

7. The process of claim 1, wherein the polymer is an at least partially photo-set polymer.

8. The process of claim 7, wherein the polymer is obtained from a photo-setting resin by irradiation at a wavelength longer than 300 nm.

* * * * *